United States Patent
Engin et al.

(10) Patent No.: US 11,330,699 B2
(45) Date of Patent: May 10, 2022

(54) NON-OVERLAPPING POWER/GROUND PLANES FOR LOCALIZED POWER DISTRIBUTION NETWORK DESIGN

(71) Applicants: San Diego State University Research Foundation, San Diego, CA (US); Kyocera International, Inc., San Diego, CA (US); Fraunhofer-Gesellschaft, Munich (DE)

(72) Inventors: Arif Ege Engin, San Diego, CA (US); Gerardo Aguirre, San Diego, CA (US); Klaus-Dieter Lang, Berlin (DE); Ivan Ndip, Berlin (DE)

(73) Assignees: San Diego State University Research Foundation, San Diego, CA (US); Kyocera International, Inc., San Diego, CA (US); Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 0 days.

(21) Appl. No.: 16/467,895

(22) PCT Filed: Dec. 14, 2017

(86) PCT No.: PCT/US2017/066542
§ 371 (c)(1),
(2) Date: Jun. 7, 2019

(87) PCT Pub. No.: WO2018/112279
PCT Pub. Date: Jun. 21, 2018

(65) Prior Publication Data
US 2021/0153341 A1 May 20, 2021

Related U.S. Application Data

(60) Provisional application No. 62/434,414, filed on Dec. 15, 2016.

(51) Int. Cl.
*H05K 1/02* (2006.01)

(52) U.S. Cl.
CPC ..... *H05K 1/0227* (2013.01); *H05K 2201/0792* (2013.01); *H05K 2201/09309* (2013.01); *H05K 2201/09345* (2013.01)

(58) Field of Classification Search
CPC ........................................ H05K 1/0224–0227
See application file for complete search history.

(56) References Cited

U.S. PATENT DOCUMENTS 5,300,899 A * 4/1994 Suski .................. H01P 3/085
174/254
6,160,316 A 12/2000 Gardner et al.
(Continued)

FOREIGN PATENT DOCUMENTS

CN 101940071 A 1/2011
CN 105307390 A 2/2016
(Continued)

OTHER PUBLICATIONS

International Search Report and Written Opinion in PCT/US2017/066542 dated Feb. 26, 2018, which is related to the present application.
(Continued)

*Primary Examiner* — Jeremy C Norris
(74) *Attorney, Agent, or Firm* — Knobbe, Martens, Olson & Bear, LLP

(57) ABSTRACT

Embodiments described herein are directed to methods and apparatus for power distribution. The apparatus can include a power distribution network for a plurality of integrated circuits (IC). According to embodiments, the power distribution network includes a plurality of overlapping power/ground (PG) plane segments and one or more non-overlapping PG (no-PG) plane segments. Each overlapping-PG
(Continued)

plane segment is separated from another overlapping-PG plane segment by at least one no-PG plane segment. The no-PG plane segments can include at least one of a multi-layered power (P) plane segment with no ground reference of any PG plane and a multilayered ground (G) plane segment with no power reference of any PG plane.

20 Claims, 16 Drawing Sheets

(56) References Cited

U.S. PATENT DOCUMENTS

| | | | |
|---|---|---|---|
| 6,465,890 | B1 | 10/2002 | Poddar et al. |
| 8,060,457 | B2 | 11/2011 | Kim et al. |
| 2001/0047588 | A1 | 12/2001 | Schaper |
| 2003/0051910 | A1 | 3/2003 | Dyke et al. |
| 2006/0151722 | A1 | 7/2006 | Cole et al. |
| 2009/0056984 | A1 | 3/2009 | Chao et al. |
| 2011/0083888 | A1 | 4/2011 | Choi et al. |
| 2013/0239408 | A1 | 9/2013 | Kim et al. |
| 2014/0055208 | A1 | 2/2014 | Kondo et al. |
| 2017/0141065 | A1 | 5/2017 | Murai et al. |

FOREIGN PATENT DOCUMENTS

| | | |
|---|---|---|
| JP | 2001-217348 | 8/2001 |
| JP | 2003-124377 | 4/2003 |
| JP | 2008-305074 | 12/2008 |
| JP | 2014-064264 | 4/2014 |
| WO | WO 2015/198839 A1 | 12/2015 |

OTHER PUBLICATIONS

Chinese Office Action received in CN application No. 201780082045.X dated Aug. 24, 2021.

German Office Action received in Application No. DE 11 2017 006 314.0, dated Nov. 8, 2021.

Japanese Office Action received in Application No. JP 2019-553161, dated Jan. 4, 2022.

* cited by examiner

FIG. 3

NON-OVERLAPPING POWER/GROUND PLANES FOR LOCALIZED POWER DISTRIBUTION NETWORK DESIGN

STATEMENT REGARDING FEDERALLY SPONSORED RESEARCH OR DEVELOPMENT

This invention was made with Government support under Award No. 1408637 awarded by the National Science Foundation. The Government has certain rights in this invention.

RELATED APPLICATIONS

This application claims the filing date of previously filed provisional applications 62/434,414, entitled "Non-Overlapping Power/Ground Planes for Localized Power Distribution Network Design," filed Dec. 15, 2016; the contents of which are incorporated herein by reference.

FIELD

Embodiments of the invention relate to the field of power and ground planes in chip packages and boards; and more specifically to nonoverlapping power/ground planes for suppression of power plane noise in power distribution network design.

BACKGROUND

Chip packages and printed circuit boards make use of power/ground (PG) planes to improve power integrity in two main aspects: they provide a low resistance (i.e., low IR-drop) connection from the chip terminals to the power supply; and they provide low inductance. To control IR-drop, multiple PG layers in a stack-up with thick metals can be used. At higher frequencies, the same PG planes can also provide a low inductance connection to the off-chip decoupling capacitors if PG layers are stacked in an alternating manner. On many package and board stack-ups, it is, therefore, a common practice to allocate several layers in an alternating manner to PG planes.

Low IR-drop and low inductance properties of PG planes, however, do not necessarily provide low impedance at higher frequencies. PG planes cause undesirable antiresonances, as they interact with the decoupling capacitors or when their sizes exceed half a wavelength. This high impedance is especially a concern for mixed-signal boards, high-speed I/Os, and electromagnetic compatibility. Controlling such noise enables faster computer systems and miniaturized tablets/phones. A general background can be found in U.S. Pat. No. 8,060,457, entitled "Systems and Methods for Electromagnetic Band Gap Structure Synthesis," which is incorporated by reference herein in its entirety.

A typical four-layered board stack-up is shown in FIG. 1. The closely spaced PG planes are desired for low inductance connection of off-chip decoupling capacitors. Therefore, it is assumed that locally each IC on a multichip board will be placed on top of traditional alternating PG layers. The PG planes in this layer stack-up, however, behave as parallel-plate waveguides and allow propagation of switching noise globally across the whole board, especially at the antiresonance frequencies.

In a mixed-signal board, the sensitive analog/RF circuits may require high levels of isolation from switching noise. High-speed I/Os may experience crosstalk noise coupled globally through the PG planes. Finally, edge radiation from PG planes is one of the main sources for electromagnetic interference. The coupling of switching noise in these cases depends on the transfer impedance of the power distribution network.

One traditional solution to control switching noise is based on decoupling capacitors, which become ineffective due to their inductance in gigahertz frequency regime. Therefore, special patterned power planes, such as power islands/archipelago or electromagnetic bandgap structures, have been used to reduce the transfer impedance. These designs provide a low-pass filter response by generating capacitive patches on the power plane connected by narrow inductive bridges. These narrow bridges, however, significantly increase the JR-drop of PG planes and result in signal integrity issues for i/Os that need to run over slits in the power plane.

Another approach is based on using quarter-wave resonators as a distributed substitute for discrete decoupling capacitors. At the design frequency, the resonators create an ac short circuit between the PG planes. An array of such resonators then can be placed in electrically short intervals to create a virtual ground fence. This bandstop-type filter is mostly suitable for narrowband systems due to the nature of quarter-wave resonators.

SUMMARY

Embodiments described herein are directed to providing isolation of gigahertz noise coupling through a power distribution network on a chip package or printed circuit board, for example, without requiring complex electromagnetic analysis.

One embodiments described herein is directed to an apparatus for power distribution. The apparatus can include a power distribution network for a plurality of integrated circuits (IC). According to embodiments, the power distribution network includes a plurality of overlapping power/ground (PG) plane segments and one or more non-overlapping PG (no-PG) plane segments. Each overlapping-PG plane segment is separated from another overlapping-PG plane segment by at least one no-PG plane segment. The no-PG plane segments can include at least one of a multi-layered power (P) plane segment with no ground reference of any PG plane and a multilayered ground (G) plane segment with no power reference of any PG plane.

Another embodiment is directed to a method of assembling a power distribution network for a plurality of ICs. The method can include overlapping a plurality of PG plane segments of power and ground planes. The method can further include forming at least one portion of at least one of the power and ground planes to form one or more no-PG plane segments, such that each overlapping-PG plane segment is separated from another overlapping-PG plane segment by at least one no-PG plane segment. The no-PG plane segments can include at least one of a multilayered P plane segment with no ground reference of any PG plane and a multilayered G plane segment with no power reference of any PG plane.

Certain embodiments, the method can include shorting power planes in the at least one multilayer P plane segment with each other using a plurality of vias to provide a parallel current path for direct current, and/or shorting ground planes in the at least one multilayer G plane segment with each other using a plurality of vias to provide a parallel current path for direct current. The method can further include separating each multilayer P plane segment from each multilayer G plane segment by a predetermined gap to reduce parasitic gap capacitance.

Yet another embodiment is directed to a transitory or non-transitory medium storing instructions thereon for, when executed by one or more processors, performing the various functional method steps described herein.

Various other features and advantages will become obvious to one of ordinary skill in the art in light of the following detailed description and drawings.

BRIEF DESCRIPTION OF THE DRAWINGS

The accompanying drawing figures incorporated in and forming a part of this specification illustrate several aspects of the disclosure, and together with the description serve to explain the principles of the disclosure.

FIG. 3 is an exemplary layout with 3×2 PG segments isolated from each other by PP and GG segments, according to an exemplary embodiment.

DESCRIPTION OF EMBODIMENTS

In the following description, numerous specific details are set forth. However, it is understood that embodiments of the invention may be practiced without these specific details. In other instances, well-known circuits, structures and techniques have not been shown in detail in order not to obscure the understanding of this description. Those of ordinary skill in the art, with the included descriptions, will be able to implement appropriate functionality without undue experimentation.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to implement such feature, structure, or characteristic in connection with other embodiments whether or not explicitly described.

In the following description and claims, the terms "coupled" and "connected," along with their derivatives, may be used. It should be understood that these terms are not intended as synonyms for each other. "Coupled" is used to indicate that two or more elements, which may or may not be in direct physical or electrical contact with each other, co-operate or interact with each other. "Connected" is used to indicate the establishment of communication between two or more elements that are coupled with each other.

The embodiments set forth below represent information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure.

Described herein are nonoverlapping PG (no-PG) planes design methodologies for filtering of gigahertz power plane noise. This approach directly controls the coupling of switching noise globally on a chip package or board. The design procedures can result in broadband isolation. Traditional alternating PG layers can be utilized for designing locally the power distribution network of each IC on a board. The power distribution networks can be connected with each other using no-PG planes that provide ultimate noise isolation. The presented no-PG planes design methodologies provide broadband filtering of power plane noise while avoiding narrow inductive bridges that increase IR-drop.

Figure 1:
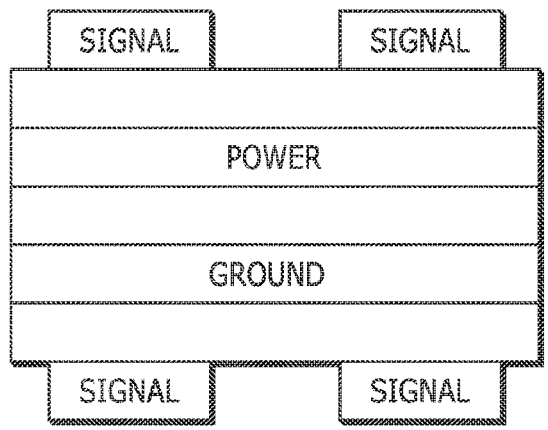
FIG. 1 shows traditional PG layers in a typical four-layered board, according to an exemplary embodiment.
Figure 2:
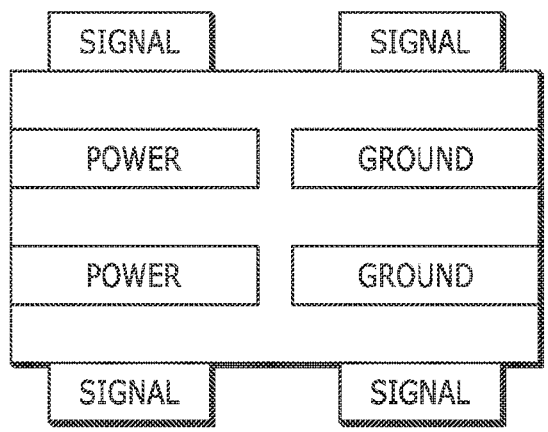
FIG. 2 shows exemplary no-PG layers designed as power/power (PP) or ground/ground (GG) layers, according to an exemplary embodiment.
Figure 3:
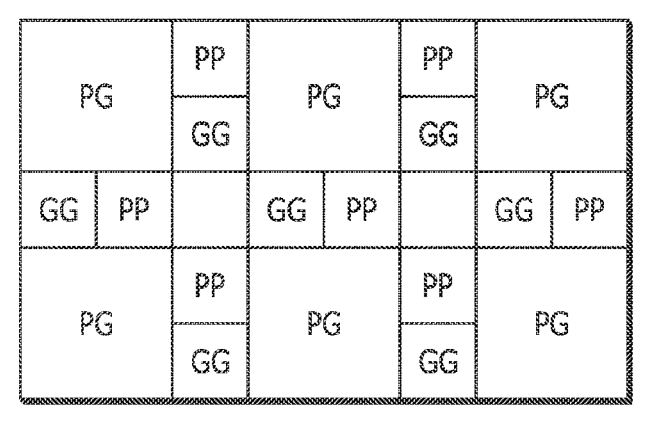

FIG. 2 shows an exemplary stack-up of PG layers, which substantially eliminates the parallel-plate currents, according to an exemplary embodiment. Here, power/power (PP) and ground/ground (GG) segments in the stack-up produce no-PG plane segments in the form of PP or GG planes globally filtering switching noise. In this embodiment, the PP and GG segments are used to serve as isolating elements among PG segments while preserving d connectivity in the layout. An example layout could then look, as shown in FIG. 3, where there are 3×2 PG segments that would be interconnected with low IR-drop, but isolated from each other at high frequencies. Any small gaps, such as the two empty squares in the exemplary layout, can then be filled with PP or GG segments, according to certain embodiments. Although the example is given for a single PG plane pair, substantially similar design approaches can be extended to designs with arbitrary number of PG layers, as would be understood by one of ordinary skill in the art, without departing from the scope of the present disclosure.

Figure 4A:
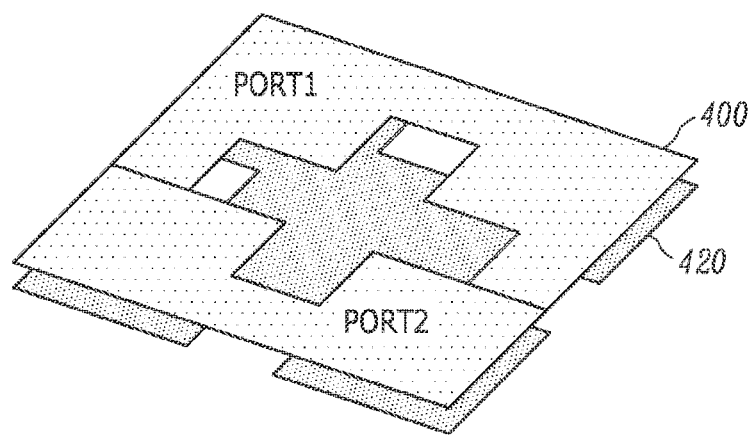
FIG. 4(a) shows a 3-D view of an exemplary board with no-PG plane segments, according to an exemplary embodiment.
Figure 4B:
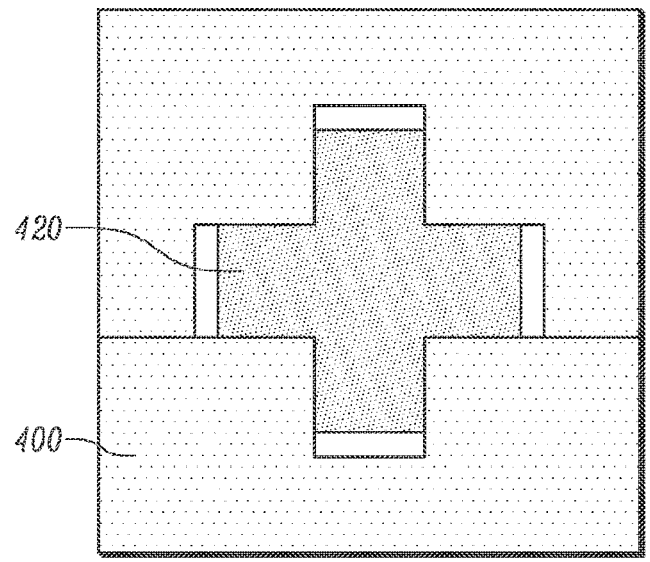
FIG. 4(b) shows atop view of the board of FIG. 4(a), according to an exemplary embodiment.
Figure 4C:
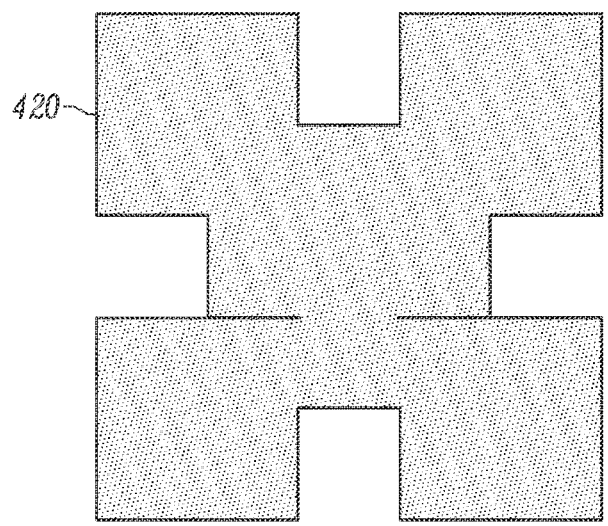
FIG. 4(c) shows the ground plane of the board of FIG. 4(a), according to an exemplary embodiment.
Figure 4D:
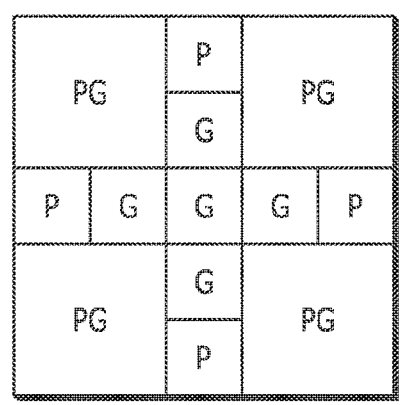
FIG. 4(d) shows a corresponding layout segmentation to the board of FIG. 4(a) with 2×2 PG segments isolated from each other with P and G segments, according to an exemplary embodiment.

To demonstrate the performance of no-PG planes, a two-layered board can be designed, as shown in FIGS. 4(a)-4(d). FIG. 4(a) shows an exemplary liquid crystal polymer (LCP) board with no-PG planes from a 3-D perspective. Of course, an LCP board is described as one particular exemplary material, but any other appropriate material could be similarly utilized. In this exemplary embodiment, power plane 400 is layered above ground plane 420 (depicted in FIG. 4(c)). FIG. 4(b) shows a top view of the board. The corresponding layout segmentation is shown in FIG. 4(d), which includes PG segments isolated from each other using P and G segments. This exemplary board includes 2×2 PG segments that are interconnected with P and G segments. In this exemplary design, P and G segments were preferred to be able to easily visualize the concept. The isolating P and G segments could be extended to PP and GG segments (or any number of no-PG layers, such as PPP or GGG segments), respectively, using vias to maintain low IR-drop.

In a practical board design, PG planes can come in arbitrary shapes and include cutouts or via holes. For such arbitrary plane shapes, the same design principles can be applied as well, by avoiding the overlap of PG planes in isolating segments. The square design depicted in FIGS. 4(a)-4(d) is for exemplary purposes only, and those skilled in the art would appreciate that any design or shape could be similarly implemented.

The signal integrity of transmission lines also needs to be considered. There may be a return path discontinuity for transmission lines running over cut regions. However, this problem is not as severe as in electromagnetic bandgap structures or power islands that require narrow bridges. The wide P and G segments described herein can allow a continuous wide return path for transmission lines running across isolated segments. One interesting aspect of the stack-up described herein is the via transitions of transmission lines through isolating PP and GG segments. Unlike traditional PG segments, the current return path discontinuity would be small, as both transmission lines would be referenced to the same voltage plane.

Figure 5A:
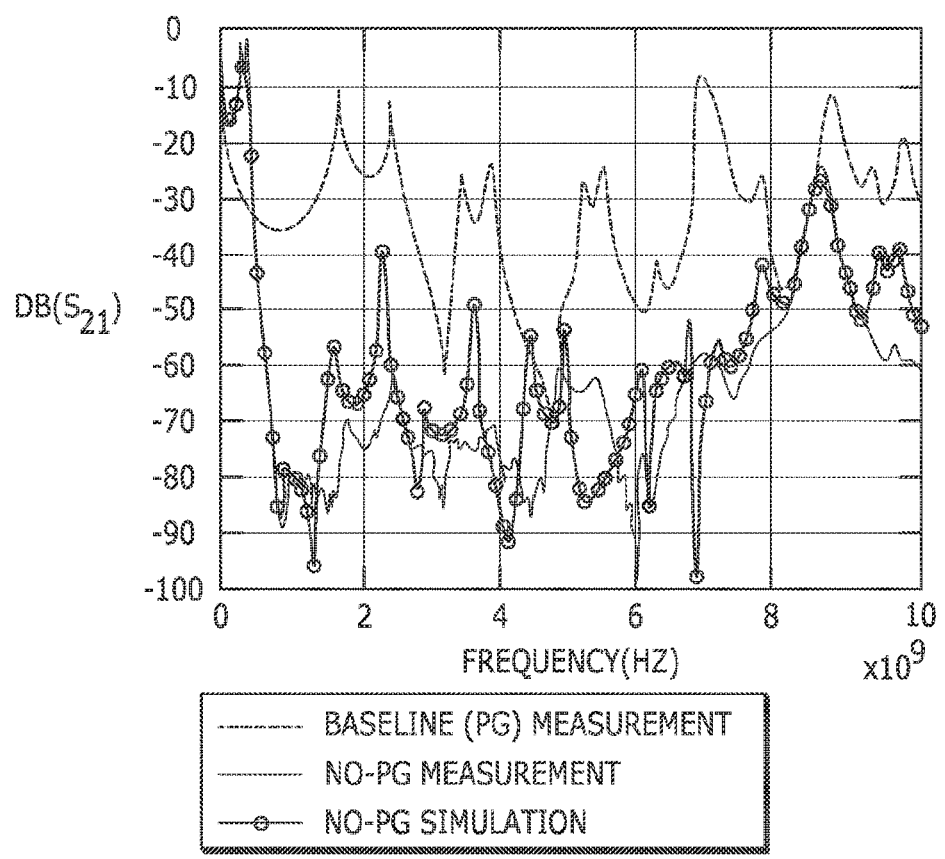
FIG. 5(a) shows a simulation to hardware correlation for a no-PG planes design, according to an exemplary embodiment.
Figure 5B:
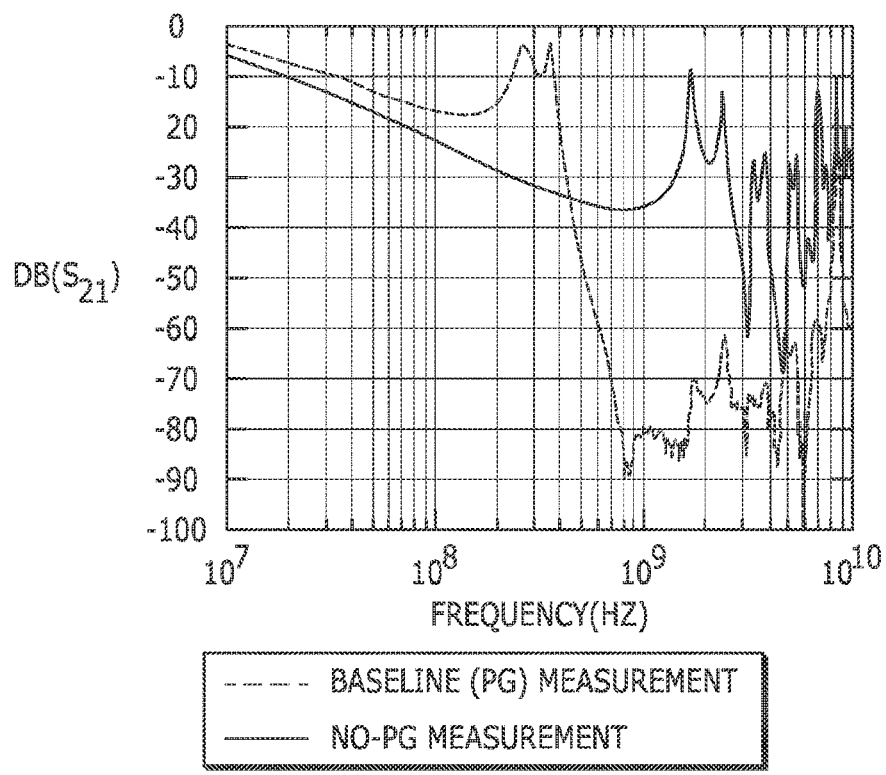
FIG. 5(b) shows the measurements plotted in FIG. 5(a), without the simulation data in logarithmic scale, according to an exemplary embodiment.
Figure 5C:
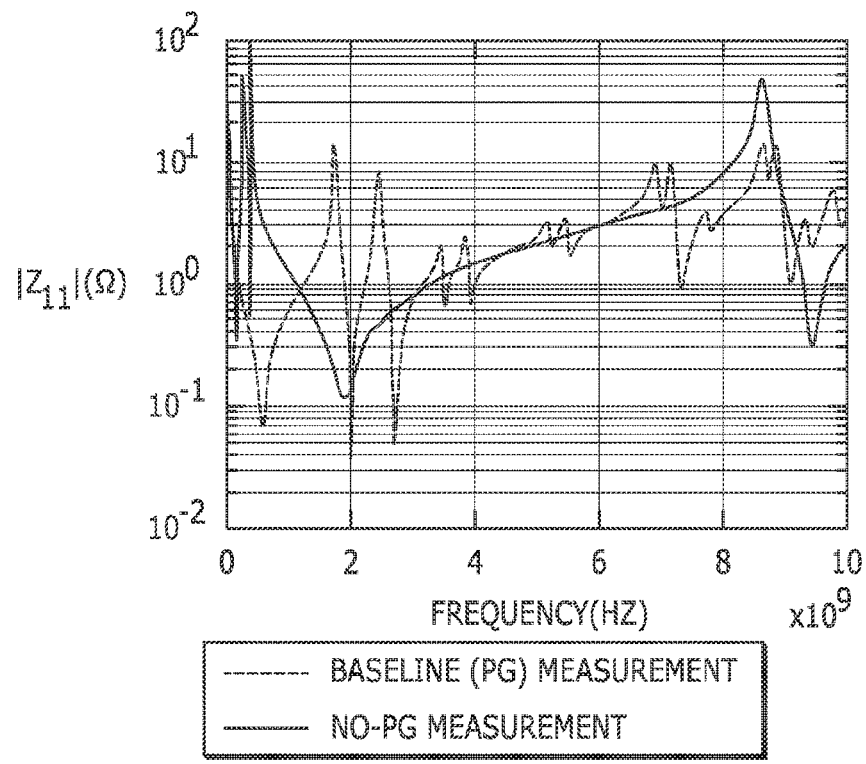
FIG. 5(c) shows measured input impedance of the no-PG design measured in FIG. 5(a), according to an exemplary embodiment.

FIGS. 5(a)-5(c) show various simulations with the no-PG planes design of FIG. 4(a)-(d). The total size of the board is 5 cm×5 cm, according to this tested example. Measurements were taken using microprobes by isolating the board from the measurement chuck using a 3-mm-thick plexiglass. Simulations predict accurately the on-set and off-set frequencies for the isolation bandwidth.

FIG. 5(a) shows a simulation to hardware correlation for no-PG planes. Measurements indicate more than 50-dB isolation from 0.6 to 8 GHz for the no-PG design, eliminating the high level of coupling of the baseline case consisting of solid PG planes. This bandwidth for isolation is outstanding and typically not achievable using existing approaches, such as power islands/archipelago, electromagnetic bandgap structures, or virtual ground fence. FIG. 5(b) shows the same measurements plotted without the simulation data in logarithmic scale for clarity. Outside of the isolation frequency band, the coupling could actually increase, as shown in FIG. 5(b). The crossover where the no-PG case has more isolation than the solid PG planes occurs at approximately 450 MHz, according to this exemplary embodiment. FIG. 5(c) shows measured input impedance of the no-PG design, with suppressed cavity resonances in its stopband. Its input impedance, however, exceeds the impedance of solid PG planes at lower frequencies. The test boards did not include any decoupling capacitors, which can address some of the coupling and increased impedance issues at these lower frequencies.

The design of the no-PG planes may depend on any one or more of the board size, port location, segment separation, segment size, and IR-drop considerations, for example.

A. Board Size

Figure 6A:
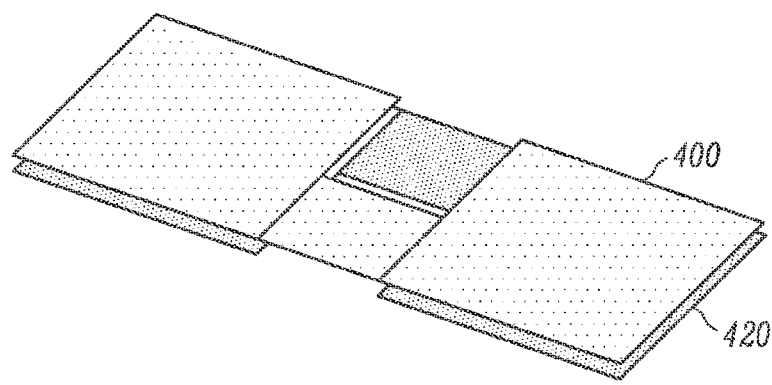
FIG. 6(a) shows a 3-D view of an exemplary board with no-PG plane segments, according to an exemplary embodiment.
Figure 6B:
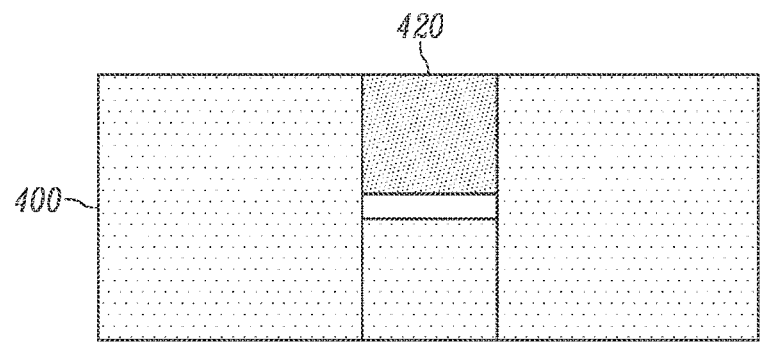
FIG. 6(b) shows atop view of the board of FIG. 6(a), according to an exemplary embodiment.
Figure 6C:
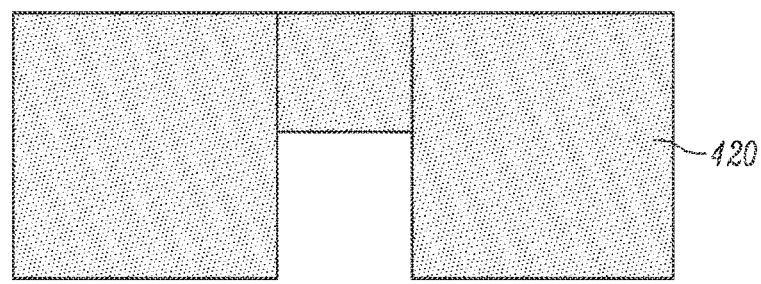
FIG. 6(c) shows the ground plane of the board of FIG. 6(a), according to an exemplary embodiment.
Figure 6D:
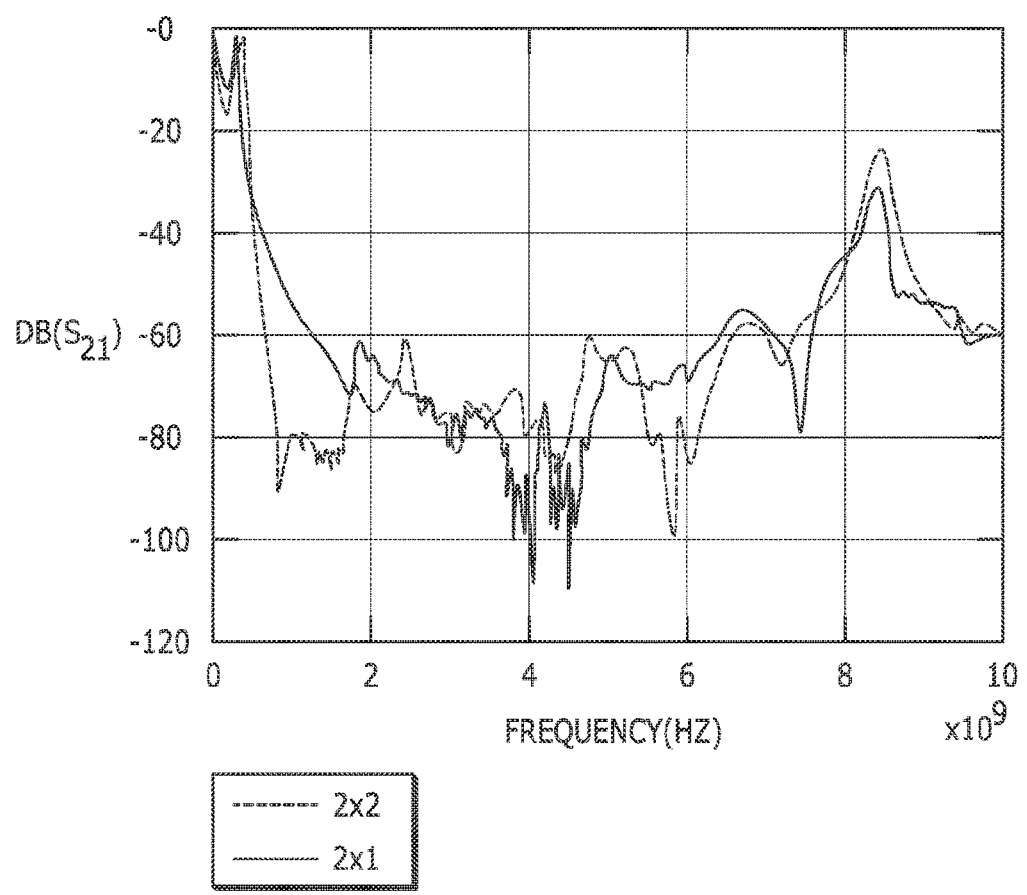
FIG. 6(d) shows a graph of measured isolation levels of a board with 2×2 and 2×1 PG segments, according to an exemplary embodiment.

An exemplary rectangular-sized board of size 5 cm×2 cm is considered, as shown in a 3-D perspective in FIG. 6(a), with power plane 400 and ground plane 420. This design includes 2×1 PG segments, and hence, the isolation is provided by a single isolating segment. However, the resulting isolation level (shown in FIG. 6(d)) is similar to the larger 2×2 board in FIGS. 4(a)-(d). Unlike conventional designs that require multiple unit cells to achieve high levels of isolation, this example demonstrates that a single isolating P and G segment is already effective to filter the power plane noise. FIG. 6(b) shows a top view of the board, while FIG. 6(c) shows the ground plane 420 alone. It should be understood that various other board sizes and shapes could be similarly employed. The board sizes described herein, along with the number of segments, are provided for exemplary purposes only, and are not intended to be limiting.

B. Port Location

Figure 7A:
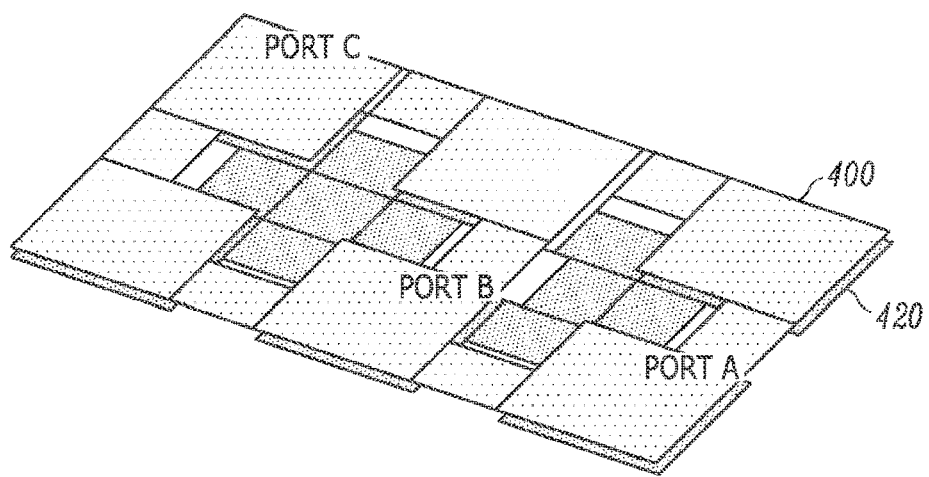
FIG. 7(a) shows a 3-D view of an exemplary board with no-PG plane segments, according to an exemplary embodiment.
Figure 7B:
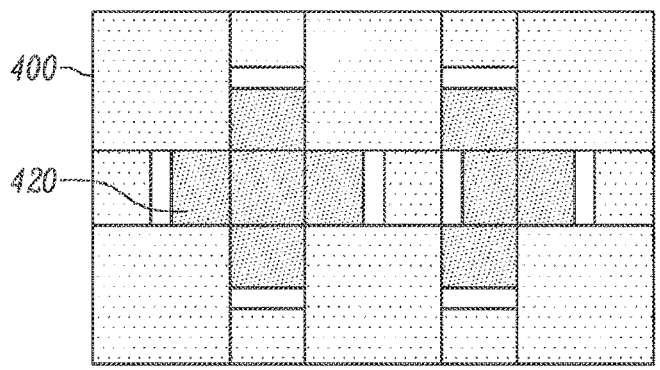
FIG. 7(b) shows a top view of the board of FIG. 7(a), according to an exemplary embodiment.
Figure 7C:
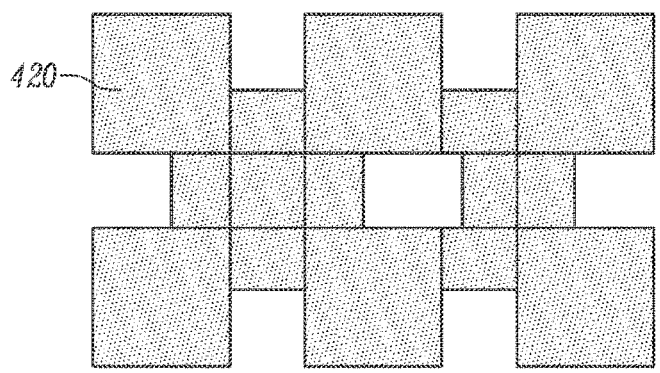
FIG. 7(c) shows the ground plane of the board of FIG. 7(a), according to an exemplary embodiment.
Figure 7D:
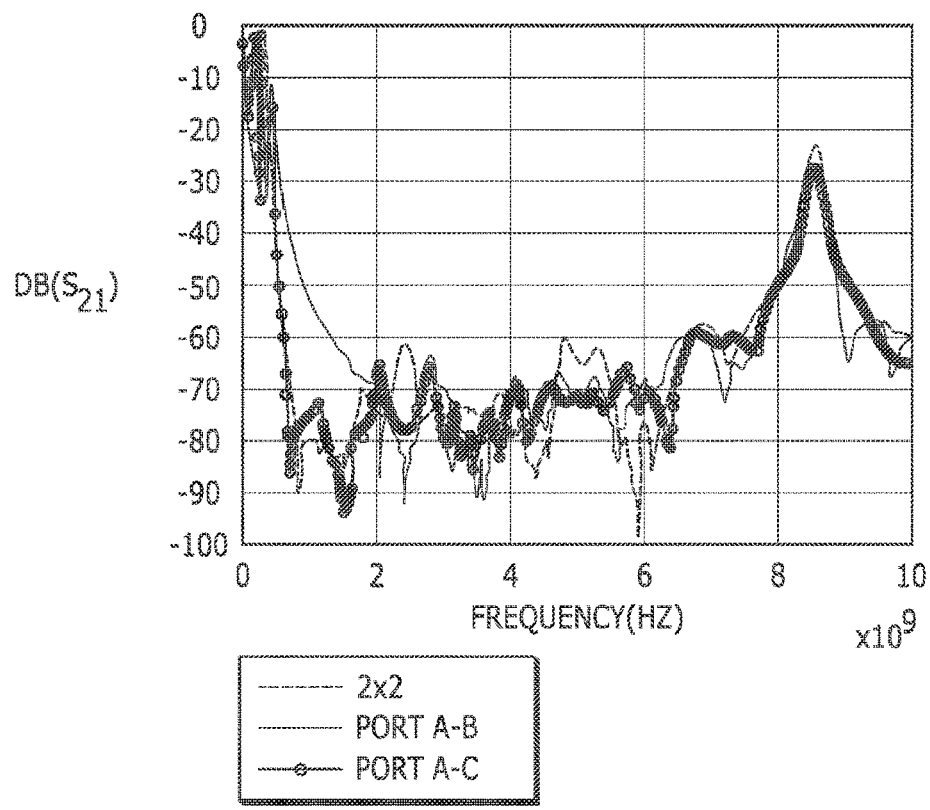
FIG. 7(d) shows a graph of measured isolation levels of a board with 2×2 PG segments and various port locations, according to an exemplary embodiment.
Figure 7E:
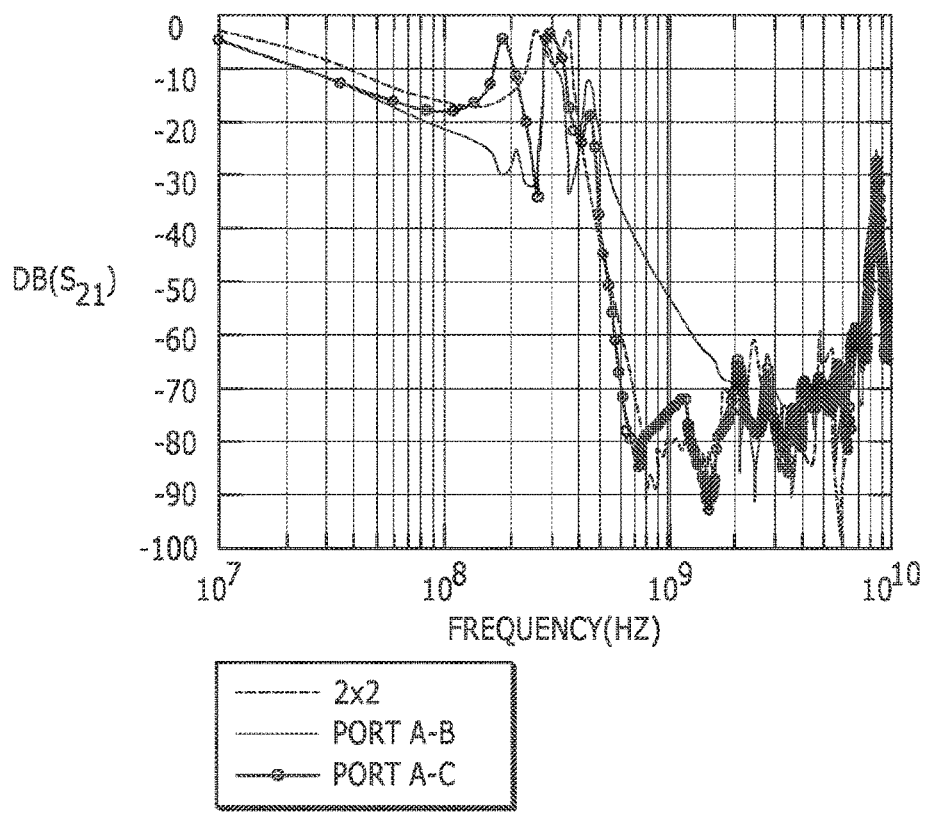
FIG. 7(e) shows a graph of the measurements of FIG. 7(d) in logarithmic scale, according to an exemplary embodiment.

A larger board of size 8 cm×5 cm with 3×2 PG segments is considered, as shown in FIG. 7(a), with power plane 400 and ground plane 420. FIG. 7(b) shows a top view of the board, while FIG. 7(c) shows the ground plane 420 alone. High isolation is achieved among various PG segments. The on-set frequency of the stopband is smaller when ports are farther from each other. In this case, the connection is achieved through multiple P and G segments. The measured off-set frequency of the stopband was similar for different port locations, as shown in FIG. 7(d) and plotted in logarithmic scale for clarify at lower frequencies in FIG. 7(e).

C. Segment Separation

Figure 8A:
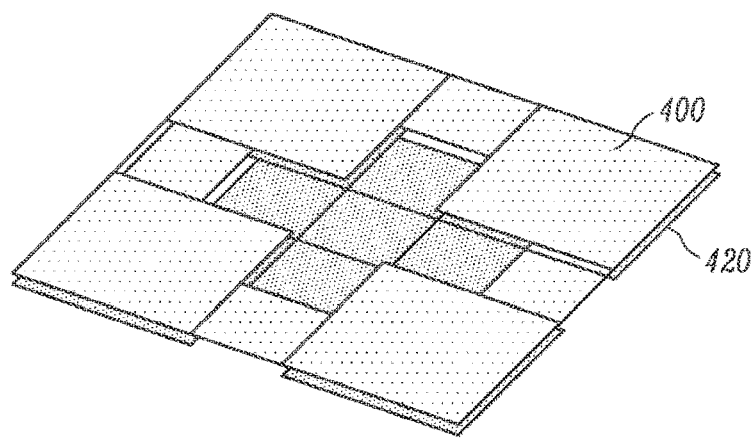
FIG. 8(a) shows a 3-D view of an exemplary board with no-PG plane segments, according to an exemplary embodiment.
Figure 8B:
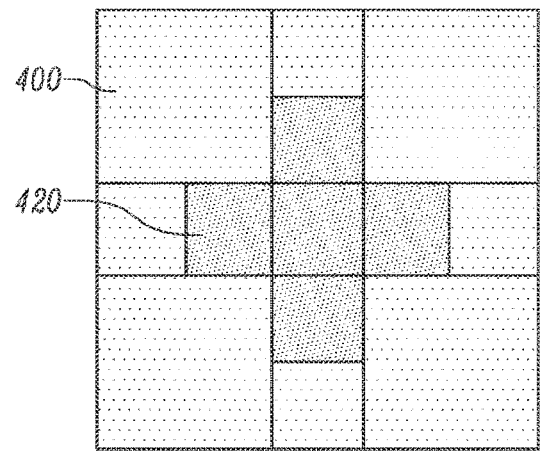
FIG. 8(b) shows atop view of the board of FIG. 8(a), according to an exemplary embodiment.
Figure 8C:
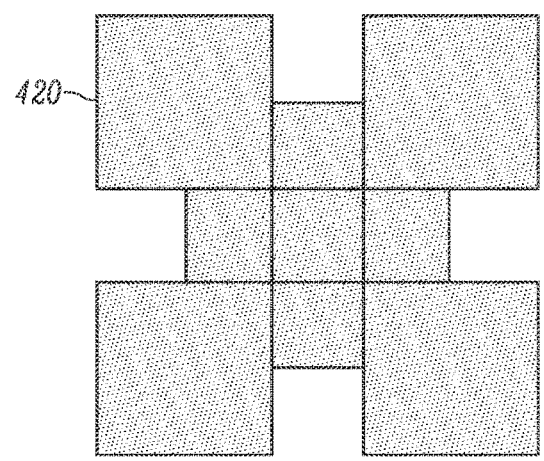
FIG. 8(c) shows the ground plane of the board of FIG. 8(a), according to an exemplary embodiment.
Figure 8D:
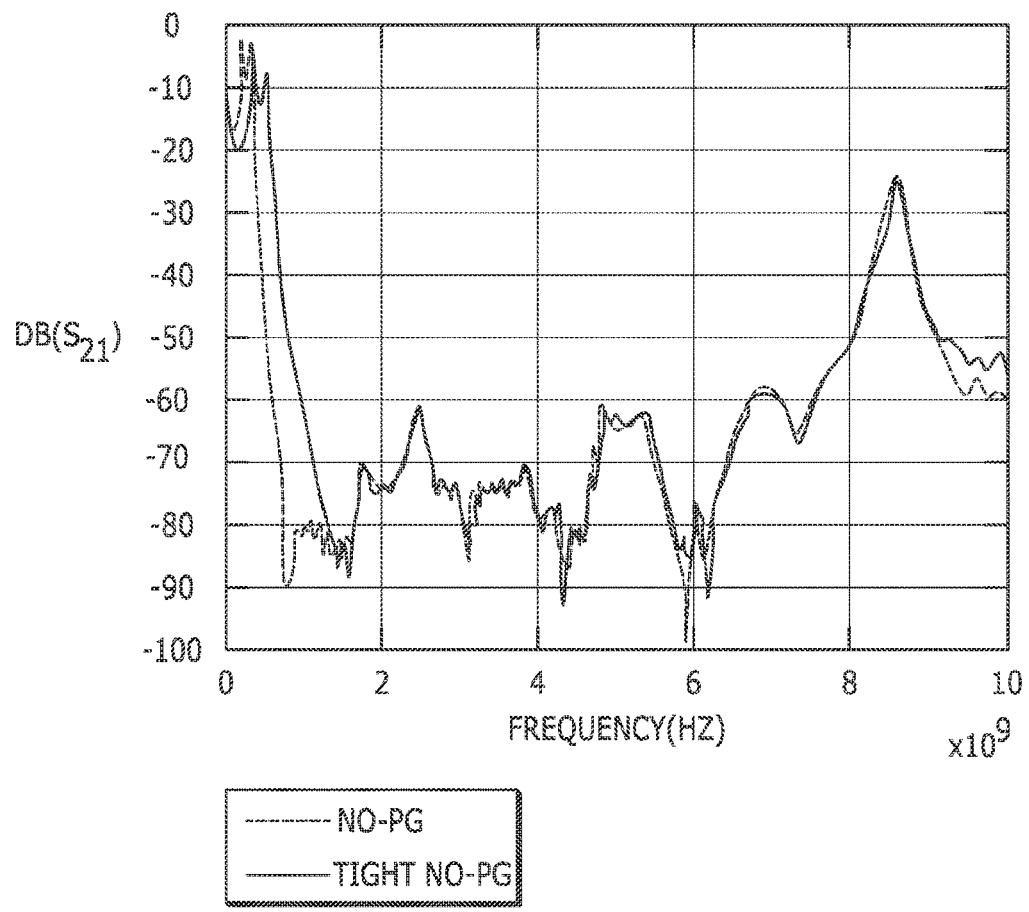
FIG. 8(d) shows a graph of measured stopband, according to an exemplary embodiment.

There may be an intentional gap between P and G segments in the no-PG design as seen from the top view in FIG. 4(c) to reduce any parasitic gap capacitance from power to ground planes. To investigate the impact of this gap capacitance, a tight design is considered in FIGS. 8(a)-8(c), where the gaps have been removed. FIG. 8(a) shows a 3-D perspective of power plane 400 and ground plane 420, while FIG. 8(b) shows a top view and FIG. 8(c) shows ground plane 420 alone. The results suggest that the gap capacitance only has an impact on the on-set frequency of the stopband, as shown in the simulation of FIG. 8(d).

D. Segment Size

Figure 9A:
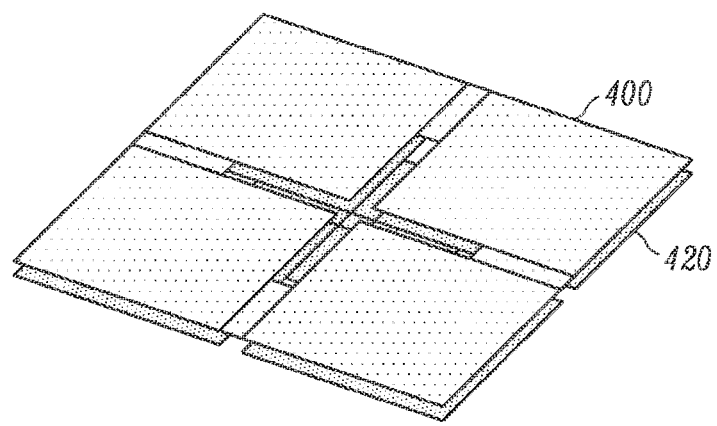
FIG. 9(a) shows a 3-D view of an exemplary board with no-PG plane segments, according to an exemplary embodiment.
Figure 9B:
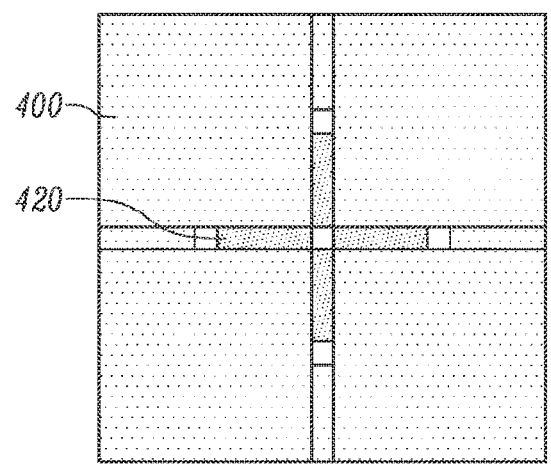
FIG. 9(b) shows atop view of the board of FIG. 9(a), according to an exemplary embodiment.
Figure 9C:
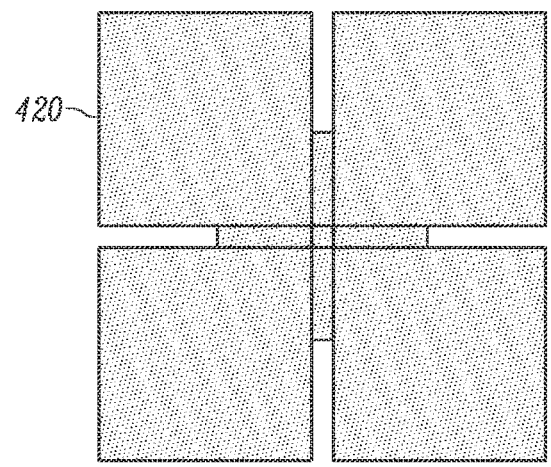
FIG. 9(c) shows the ground plane of the board of FIG. 9(a), according to an exemplary embodiment.
Figure 9D:
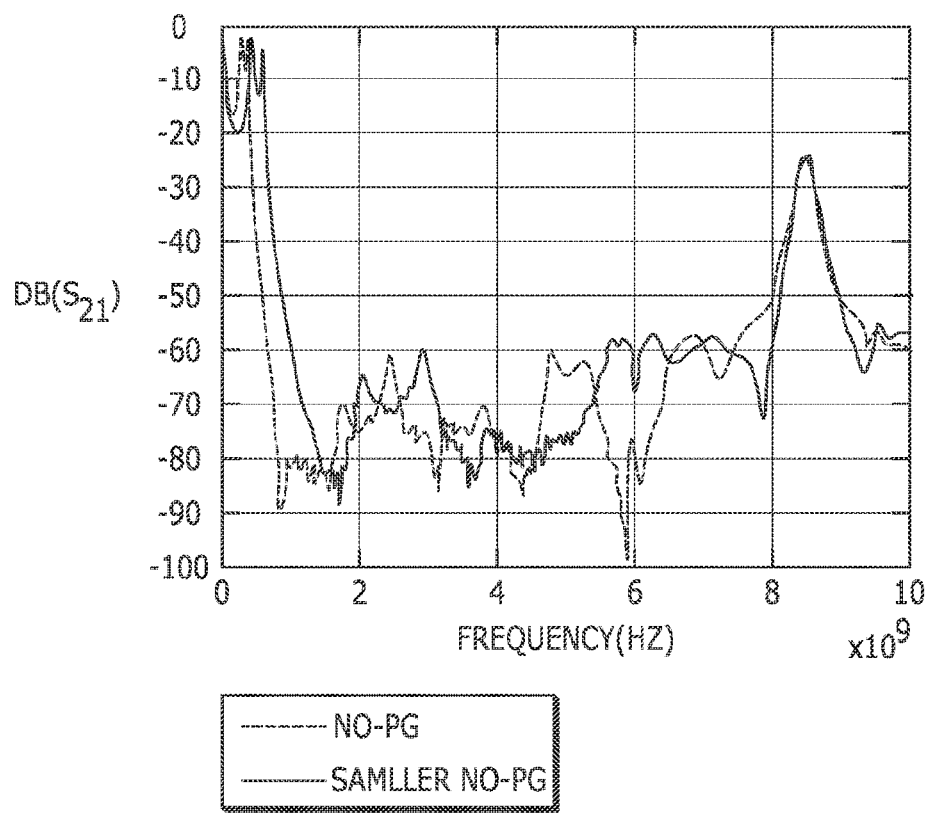
FIG. 9(d) shows a graph of measured stopband, according to an exemplary embodiment.

The length of the isolating PP and GG segments can be made shorter if necessary. A modified design with smaller segments is considered in FIGS. 9(a)-9(c), where the overall size of the board has been reduced to 4.2 cm×4.2 cm due to the shorter isolating segments. FIG. 9(a) shows a 3-D perspective of power plane 400 and ground plane 420. FIG. 9(b) shows a top view, while FIG. 9(c) shows ground plane 420 alone. The length of the isolating sections primarily has an impact on the on-set frequency of the stopband, as shown in the simulation of FIG. 9(d).

E. Low IR-Drop

Figure 10A:
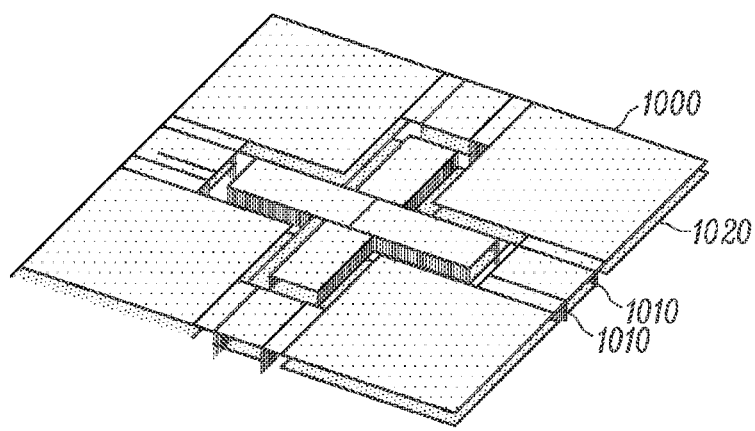
FIG. 10(a) shows a 3-D view of an exemplary board with multilayer no-PG plane segments with vias, according to an exemplary embodiment.
Figure 10B:
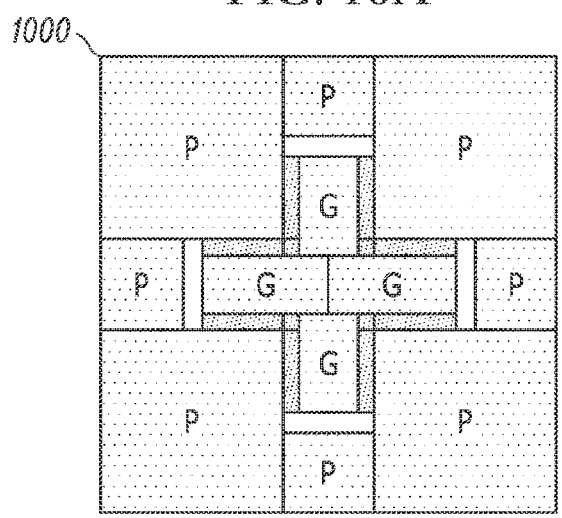
FIG. 10(b) shows a top view of the board of FIG. 10(a), according to an exemplary embodiment.
Figure 10C:
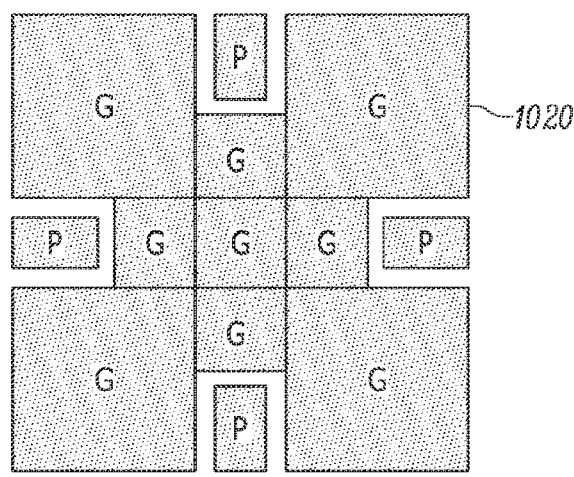
FIG. 10(c) shows the bottom plane of the board of FIG. 10(a), according to an exemplary embodiment.

The lowest IR-drop would be achieved for solid PG planes. Due to the cut-outs in P and G segments, their IR-drop could double as compared to the solid PG planes, assuming a tight design and neglecting current crowding. This increase may, however, not be as significant as the IR-drop through electromagnetic bandgap structures or power islands, which require narrow P segments. To further reduce IR-drop, PP and GG segments (or any other number of layers) can be used as in FIG. 10(a)-10(c) instead of P and G segments as in FIGS. 4(a)-(d). FIG. 10(a) shows a 3-D perspective of various PP and GG segments made from top layer 1000 and bottom layer 1020. The planes in PP and GG segments, for example, can be shorted with each other using any number of vias 1010. This provides a parallel current path for dc currents, which helps the IR-drop to approach that of solid PG planes, neglecting via resistance and current crowding effects. FIG. 10(b) shows a top view including a top layer 1000 with power segments P surrounding ground segments G, while FIG. 10(c) shows a bottom layer 1020 including four small patches for power P amongst ground patches G. As such, the vias 1010 connect P plane segments on different layers and/or G plane segments on different layers to form multilayer isolating segments (PP or GG segments, in this example). P and G segments should not touch each other or connect, which would cause a short circuit of the power supply to ground.

Figure 10D:
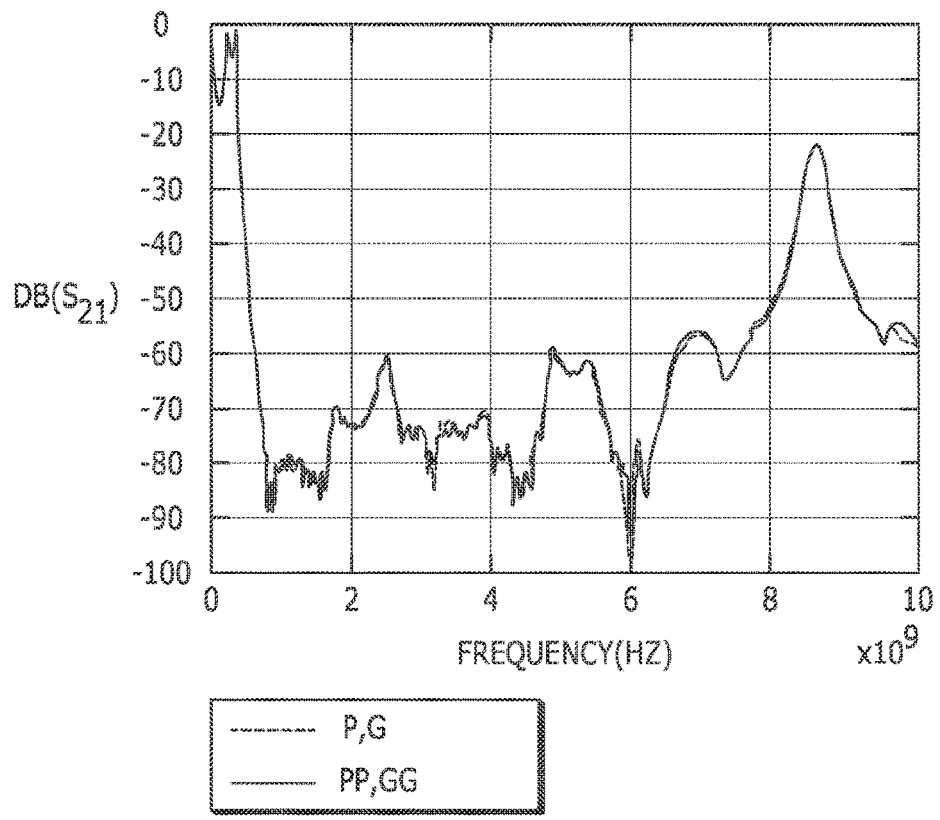
FIG. 10(d) shows a graph of measured stopband, according to an exemplary embodiment.

As noted herein, the shape and design of such planes, segments and patches is merely exemplary and various other designs and combinations thereof may be implemented within the scope of the disclosure. The presence of these vias 1010 and PP and GG plane segments does not affect the high-frequency performance, as shown in the simulation of FIG. 10(d) showing on-set frequency of the stopband, as compared to using P and G segments.

Figure 11:
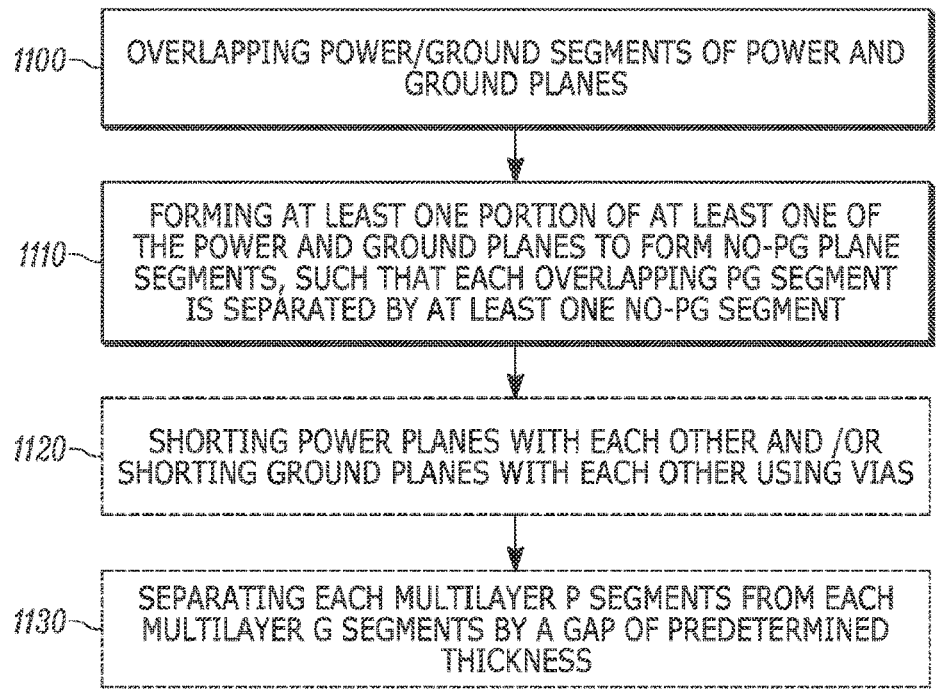
FIG. 11 is an exemplary flowchart illustrating a method of assembling a power distribution network for a plurality of integrated circuits, according to an exemplary embodiment.

FIG. 11 is an exemplary flowchart illustrating a method of assembling a power distribution network for a plurality of integrated circuits. As shown in FIG. 11, at step 1100, power and ground segments of power and ground planes are overlapped to form the PG segments. According to certain embodiments, each TC on a multichip board, for example, can be placed on the overlapping PG segments. From step 1100, the process moves to step 1110, where at least one portion of at least one of the power and ground planes are formed such that no-PG plane segments are formed. As described herein, each overlapping PG segment can be separated by a least one no-PG segment. A no-PG segment can be simply a P or G segment, or can be a multilayered segment, such as PP or GG segment (or any other number of layers).

Optionally, at step 1120, in the case of implementation of multilayered isolation segments, power plane segments can be shorted with each other and ground plane segments can be shorted with each other using any number of vias 1010. This shorting provides a parallel current path for dc currents, thereby improving the IR-drop, without affecting high-frequency performance. Optionally, at step 1130, each multilayer P segment can be separated from each multilayer G segment by a gap with selectable and predetermined thickness.

Of course, the order of the exemplary method steps is merely one possible order, and one of ordinary skill in the art would realize that performing steps in any combination and any order could be executed within the scope of the present disclosure. Any conventional hardware, machinery, processors or systems for assembling such a power distribution network on a chip package for printed circuit board automatically, for example, can be implemented to perform the functions described herein, and are incorporated by reference.

Embodiments described herein provide outstanding isolation levels and bandwidth using no-PG planes. The approaches described herein overcome some of the major shortcomings of existing approaches for gigahertz power integrity as it is not required to have narrow power plane bridges that increase IR-drop and cause return path discontinuities. Isolation of gigahertz noise coupling through the power distribution network has been observed for various design options, indicating a robust design approach that does not require complex electromagnetic analysis. Segmenting the PG planes using approaches herein can allow localized power distribution network design, radically simplifying the current power distribution network design processes.

Methods described herein may be implemented as software and executed by a general purpose computer. For example, such a general purpose computer may include a control unit/controller or central processing unit ("CPU"), coupled with memory, EPROM, and control hardware. The CPU may be a programmable processor configured to control the operation of the computer and its components. For example, CPU may be a microcontroller ("MCU"), a general purpose hardware processor, a digital signal processor ("DSP"), an application specific integrated circuit ("ASIC"), field programmable gate array ("FPGA") or other programmable logic device, discrete gate or transistor logic, discrete hardware components, or any combination thereof designed to perform the functions described herein. A general-purpose processor can be a microprocessor, but in the alternative, the processor can be any processor, controller, or microcontroller. A processor can also be implemented as a combination of computing devices, for example, a combination of a DSP and a microprocessor, a plurality of microprocessors, one or more microprocessors in conjunction with a DSP core, or any other such configuration. Such operations, for example, may be stored and/or executed by an onsite or remote memory.

While not specifically shown, the general computer may include additional hardware and software typical of computer systems (e.g., power, cooling, operating system) is desired. In other implementations, different configurations of a computer can be used (e.g., different bus or storage configurations or a multi-processor configuration). Some implementations include one or more computer programs executed by a programmable processor or computer. In general, each computer may include one or more processors, one or more data-storage components (e.g., volatile or non-volatile memory modules and persistent optical and magnetic storage devices, such as hard and floppy disk drives, CD-ROM drives, and magnetic tape drives), one or more input devices (e.g., mice and keyboards), and one or more output devices (e.g., display consoles and printers).

While the invention has been described in terms of several embodiments, those skilled in the art will recognize that the invention is not limited to the embodiments described, can be practiced with modification and alteration within the spirit and scope of the appended claims. In particular, the disclosure can be modified in terms of hardware and materials used to form the apparatus described herein. Any conventional or otherwise known materials could be implemented with the scope of the present disclosure. The description is thus to be regarded as illustrative instead of limiting.

What is claimed is:

1. An apparatus for power distribution, comprising:
   a power distribution network for a plurality of integrated circuits (IC), wherein
      the power distribution network includes a plurality of overlapping power/ground (PG) plane segments and one or more non-overlapping PG (no-PG) plane segments, and
      each overlapping-PG plane segment is separated from another overlapping-PG plane segment by at least one no-PG plane segment,
      where the one or more no-PG plane segments comprise at least one of a multilayered power (P) plane segment with no ground reference of any PG plane and a multilayered ground (G) plane segment with no power reference of any PG plane.

2. The apparatus of claim 1, wherein each of the at least one no-PG plane segment comprises a power (P) plane segment or a ground (G) plane segment.

3. The apparatus of claim 2, wherein each P plane segment is separated from each G plane segment by a predetermined gap to reduce parasitic gap capacitance.

4. The apparatus of claim 1, wherein power planes in the at least one multilayer P plane segment are shorted with each other using a plurality of vias to provide a parallel current path for direct current.

5. The apparatus of claim 1, wherein ground planes in the at least one multilayer G plane segment are shorted with each other using a plurality of vias to provide a parallel current path for direct current.

6. The apparatus of claim 1, wherein each multilayer P plane segment is separated from each multilayer G plane segment by a predetermined gap to reduce parasitic gap capacitance.

7. The apparatus of claim 1, wherein each IC is assembled on an overlapping PG plane segment.

8. The apparatus of claim 1, wherein the apparatus is a printed circuit board.

9. The apparatus of claim 1, wherein the apparatus is a chip package.

10. A method of assembling a power distribution network for a plurality of integrated circuits (IC), comprising:
    overlapping a plurality of power/ground (PG) plane segments of power and ground planes; and
    forming at least one portion of at least one of the power and ground planes to form one or more non-overlapping PG (no-PG) plane segments, such that each overlapping-PG plane segment is separated from another overlapping-PG plane segment by at least one no-PG plane segment,
    where the one or more no-PG plane segments comprise at least one of a multilayered power (P) plane segment with no ground reference of any PG plane and a multilayered ground (G) plane segment with no power reference of any PG plane.

11. The method of claim 10, wherein each of the at least one no-PG plane segment comprises a power (P) plane segment or a ground (G) plane segment.

12. The method of claim 11, wherein each P plane segment is separated from each G plane segment by a predetermined gap to reduce parasitic gap capacitance.

13. The method of claim 10, further comprising:
    shorting power planes in the at least one multilayer P plane segment with each other using a plurality of vias to provide a parallel current path for direct current.

14. The method of claim 10, further comprising:
    shorting ground planes in the at least one multilayer G plane segment with each other using a plurality of vias to provide a parallel current path for direct current.

15. The method of claim 10, further comprising:
    separating each multilayer P plane segment from each multilayer G plane segment by a predetermined gap to reduce parasitic gap capacitance.

16. The method of claim 10, wherein each IC is assembled on an overlapping PG plane segment.

17. The method of claim 10, wherein the forming of the one or more no-PG plane segments comprises determining which portion of power and/or ground planes is a location for a no-PG plane segment, based on one or more of a board size, one or more port locations, plane and ground segment separation distance, a desired length of the no-PG plane segments, and IR-drop.

18. The method of claim 10, wherein the power distribution network is assembled on a printed circuit board.

19. The method of claim 10, wherein the power distribution network is assembled on a chip package.

20. A non-transitory computer-readable medium, storing instructions thereon which, when executed by one or more processors, perform the method of claim 10.

* * * * *